United States Patent
Khalouf et al.

(10) Patent No.: US 7,792,165 B2
(45) Date of Patent: Sep. 7, 2010

(54) DISPERSION COMPENSATING VARACTOR CIRCUIT

(75) Inventors: Ihab Khalouf, Allentown, PA (US); Richard Meier, Abington, PA (US); Shutong Zhou, Lansdale, PA (US)

(73) Assignee: General Instrument Corporation, Horsham, PA (US)

( * ) Notice: Subject to any disclaimer, the term of this patent is extended or adjusted under 35 U.S.C. 154(b) by 109 days.

(21) Appl. No.: 12/059,081

(22) Filed: Mar. 31, 2008

(65) Prior Publication Data
US 2009/0245309 A1 Oct. 1, 2009

(51) Int. Cl.
*H01S 3/00* (2006.01)
(52) U.S. Cl. .................. 372/38.02; 372/38.08; 372/38.1
(58) Field of Classification Search ............... 372/38.02, 372/38.08, 38.1
See application file for complete search history.

(56) References Cited

U.S. PATENT DOCUMENTS

| | | | |
|---|---|---|---|
| 5,115,440 A * | 5/1992 | Gysel et al. ............... | 372/38.08 |
| 5,146,192 A | 9/1992 | Kondo et al. | |
| 5,302,922 A * | 4/1994 | Heidemann et al. ........... | 333/18 |
| 5,930,696 A | 7/1999 | Tzuang et al. | |
| 7,057,474 B2 * | 6/2006 | Miller ......................... | 333/164 |
| 2007/0264027 A1 | 11/2007 | Zhou | |

OTHER PUBLICATIONS

PCT International Search Report & Written Opinion; RE: Application #PCT/US2009/037909 May 20, 2009.

* cited by examiner

*Primary Examiner*—Minsun Harvey
*Assistant Examiner*—Kinam Park
(74) *Attorney, Agent, or Firm*—Larry T. Cullen

(57) ABSTRACT

Improved dispersion compensating circuits for optical transmission systems are disclosed. According to the improved method, there is provided a compensation circuit comprising a varactor diode network. The network is preferably inserted between a source of laser modulating signal and the laser. A low-pass filter or all pass filter constructs the network. The network preferably includes an inductor or inductors and a combined circuit, which includes varactors. The network preferably provides an amplitude dependent delay of the modulating signal applied to the laser or to the optical receiver as post dispersion correction circuitry. In a first embodiment, a fixed capacitor is in series with a varactor and connected to a DC bias through inductor. Additional embodiments, using multiple varactors in different circuit configurations, with particular advantages for various applications identified.

18 Claims, 2 Drawing Sheets

DISPERSION COMPENSATING VARACTOR CIRCUIT

BACKGROUND

1. Field of the Invention

The present invention relates to fiber optic transmission systems and dispersion compensating circuits associated with optical transmission systems. In particular the present invention compensates for the laser chirp and chromatic dispersion distortions to enable effective broadband transmission and extended fiber link reach.

2. Background of the Invention

Optical transmission systems are widely used to transmit data on a broadband network. In a typical optical transmission system, a laser provides an optical signal at a predetermined frequency, which is typically modulated to provide an optical transmission data signal.

In Broadband Passive Optical Network (B-PON) or Gigabit-Passive Optical Network (G-PON) applications, the longest distance is 20 km. So the dispersion compensation needs only to be adequate for fiber lengths up to 20 km.

In Hybrid Fiber Coaxial (HFC) networks and narrowcast overlay digital applications, where analog and digital channels are combined at the HFC hub site, operators are requesting Dense Wavelength Division Multiplexing (DWDM) narrowcast transmitters, to transmit at higher optical power, e.g., 10 dBm, and to carry wider bandwidth of digital payload for longer reach, e.g., up to 100 KM of single mode fiber. Extending the link reach will produce Low Frequency Noise Rise (LFNR) due to fiber dispersion in the analog channels band.

Normally a 1550 nm (nanometer) optical signal is assigned for video signal transmission. Typically, an externally modulated laser is selected as the optical source because it has much lower laser chirp than a directly modulated laser transmitter. Laser chirp is the shift in the laser output wavelength/frequency resulting from the modulating signal. A directly modulated laser transmitter, especially a high power laser transmitter, may have a total laser chirp up to several GHz because of the large laser modulation Radio Frequency (RF) current. The large total laser chirp helps improve the Stimulated Brillouin Scattering (SBS) suppression optical power level, but as a result of fiber dispersion, introduces serious second order distortions, such as Composite Second Order (CSO) distortion.

When the chirped optical frequencies pass through a fiber, different optical wavelengths propagate at different group velocities, which causes delay dispersion at the receiving end and often causes distortions in the communication signal. CSO distortions often occur in the low −40 dBc range. For the B-PON or G-PON laser transmitter to be effective, the laser transmitter CSO distortions should be better than −60 dBc. A narrowcast laser transmitter, which transmits for example 100 MHz of digital payload of 256 QAM, and depending on the laser chirp and fiber link reach, could produce more than 5 dB of LFNR in the analog channels frequency domain, which greatly degrades the transmission of analog channels in case of a narrowcast overlay application. Accordingly, a high degree of CSO correction ability in the high frequencies and very accurate adjustable distortion compensation is needed in order to use a directly modulated laser.

The problem of fiber dispersion compensation has been investigated in great detail and various techniques have been used to solve this problem. The solutions were in both optical domain and electronic domain.

Dispersion compensation fiber (DCF) or chirp fiber Bragg grating (CFBG) can be used for the compensation devices in the optical domain. DCF is an optical fiber that has exactly the opposite dispersion effect as a regular single mode fiber. CFBG is a component that reverses the group delay compared to the ordinary fiber group delay between wavelengths.

The advantage of optical technique is its precision. However, the DCF is costly, adds attenuation, needs additional amplifications and is difficult to adjust/readjust. The CFBG optical attenuation is low, but optical bandwidth is limited to about one nm, thus reducing laser source choices and introducing the need to stabilize laser wavelength.

Electronic compensation techniques are significantly more cost effective. In the electronic domain, pre-chirp compensation techniques have been widely used in digital applications.

One method is described in U.S. Pat. No. 5,115,440 to Hermann Gysel, et al. In this patent, a single varactor-tuned delay line network is inserted between the modulating signal source and the laser. A varactor is a type of diode designed to function as a variable capacitor, the varactor's capacitance is a function of the instantaneous voltage impressed on its terminals. The delay line network provides an instant amplitude-dependent delay of the positive portion of the modulating signal applied to the laser and compensates the fiber delay caused distortion so that the CSO distortion can be reduced. This electrical compensation technique is not sensitive to the transmitted optical wavelength, it works for all 1550 Dense Wavelength Division Multiplexing (DWDM) and Coarse Wavelength Division Multiplexing (CWDM) system applications, and is easy to adjust electronically.

This approach worked very well for low optical power (1-3 mw) lasers with relatively large laser chirp (1.8 Ghz/ma). However, modern 1550 nm lasers have much lower laser chirp and may have much larger optical power, e.g., laser chirp now may be between 0.03-0.1 Ghz/ma and optical power may up to 10-20 mw, i.e., 10-13 dBm.

Large optical power is important for B-PON and G-PON applications as well as for narrowcast transmitters in HFC networks. A large optical output power laser usually has more total laser chirp, so the SBS suppression optical power level will be larger. Further, when light having a larger optical power transmits through an Erbium Doped Fiber Amplifier (EDFA), it improves the systems' signal-to-noise ratio.

A directly modulated laser transmitter has advantages for use in a B-PON or G-PON system, if CSO distortion problems can be eliminated. Directly modulated laser transmitters are much cheaper than externally modulated laser transmitter. Reliability and temperature stability of the directly modulated laser transmitters are much better than the externally modulated laser transmitters. In the directly modulated laser transmitter, the Optical Modulation Index (OMI) is usually at least 1-2 dB higher than for an externally modulated laser transmitter. Thus the signal-to-noise ratio of the B-PON system using directly modulated laser transmitter can be 1-2 dB higher. By using the directly modulated laser transmitter, due to the large laser total chirp, the SBS suppression optical power level can be higher than for the externally modulated laser transmitter. This is very useful for B-PON and G-PON applications.

Reducing and eliminating LFNR in DWDM narrowcast transmitters is important in the transmission success of DWDM narrowcast overlay applications.

Large optical power usually requires larger RF drive voltages. For example, for most 1550 nm lasers with a power range from 10-13 dBm, the peak RF drive voltage will be 4-8 volts. For older, low optical power lasers, peak RF driving voltages were less than one volt. Driving the varactor with large RF voltages greatly increases the nonlinearity of the capacitance change with voltage. Due to the large RF driving voltage, compared to the prior art, the RF driving voltage needs to be pre-distorted in order to provide a linear change in capacitance. Also, a very smooth control of dispersion compensation method is needed for CSO correction.

What is needed is a varactor network for distortion compensation to be used with 1550 nm lasers that have a chirp between 0.03-0.1 Ghz/ma and optical power up to 10-13 dBm.

BRIEF SUMMARY

The present invention provides circuitry that improves the capabilities and performance of fiber optic transmission systems by improving the CSO distortion caused by fiber dispersion in the transmitter side or at the receiver side of an optical CATV communication system. The present invention may be used as post-dispersion circuitry in a CATV HFC optical receiver module, where this circuitry could be placed after an optical receiver and an RF amplifier to compensate for fiber dispersion and improve CSO performance and hence extend fiber link reach.

In accordance with an aspect of the present invention, an apparatus comprising a capacitive structure may be used with an input signal. The capacitive structure includes a capacitor and a varactor, the combination of which linearizes the capacitance of the capacitive structure under a large voltage and RF signal with one bias control. Accordingly, the apparatus may be used with 1550 nm lasers that have a chirp between 0.03-0.1 Ghz/ma and optical power up to 10-13 dBm.

In accordance with another aspect of the present invention, an apparatus comprising a capacitive structure may be used with an input signal. The capacitive structure includes a varactor and varactor bank (i.e. more than one varactor, e.g., two or three varactors), the combination of which linearizes the capacitance of the capacitive structure under a large voltage and RF signal with two separate bias controls. Accordingly, the apparatus may be used with 1550 nm lasers that have a chirp between 0.03-0.1 Ghz/ma and optical power up to 10-13 dBm.

A system in accordance with an aspect of the present invention includes an apparatus for use with an input signal. The apparatus comprises a capacitive structure and an inductor or inductors. The capacitive structure and the inductor or the inductors are arranged as a low-pass filter or all pass filter for the input signal and are arranged to provide an output signal. The capacitive structure comprises a varactor and a capacitor. The varactor is disposed in series with the capacitor.

The present invention offers compensation methods for the nonlinear varactor capacitance change thereby permitting larger amplitude RF driving voltage. Thus, linearized delay time compensation can be obtained even with large RF drive voltage. This compensating delay can be easily adjusted so that different length fibers can be precisely compensated for with high degree of accuracy. The CSO improvement, for 20 km fiber lengths, can be over 20 dB at high frequencies at 10-13 dBm optical output power.

The capacitive structure comprises a first varactor and a varactor bank. The first varactor is disposed in series with the varactor bank. The varactor bank comprises a second varactor and a possible third varactor, arranged in parallel and have opposite polarity to the first varactor. Exemplary embodiments of this aspect may further comprise a first DC bias source and a second DC bias source. The first varactor is controlled by both DC bias sources, whereas the varactor bank is controlled only by the second DC bias source. These two DC bias source have opposite polarity.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate exemplary embodiments of the present invention and, together with the description, serve to explain the principles of the invention. In the drawings.

DETAILED DESCRIPTION

The capacitance of a varactor at any voltage can be expressed by:

$$C(V) = C_{j0}(1 - V/V_{bi})^{-\gamma} = C_{j1}(V_{bi} - V)^{-\gamma}, \quad (1)$$

$$\text{where } C_{j1} = C_{j0}(V_{bi})^{-\gamma}. \quad (2)$$

Here C(V) is the varactor capacitance at any instant voltage. $C_{j0}$ is the varactor capacitance measured at zero voltage. $V_{bi}$ is the varactor junction voltage. $\gamma$ is the varactor doping profile parameter. For example, $\gamma=0.5$ for an abrupt junction, $\gamma=1$ for a hyper-abrupt junction.

The group delay for the delay-compensating network may be given by:

$$T_{gd} = (L_1 * C(V))^{1/2}; \quad (3)$$

$$\delta T_{gd} = (\tfrac{1}{2}) * (\delta C/C) * T_{gd}. \quad (4)$$

Here $T_{gd}$ is the varactor network delay time, $L_1$ is the inductance in the delay network, and $\delta T_{gd}$ is the delay time difference selected for the dispersion compensation.

The RF signal swing at the varactor causes the capacitance of the varactor to change. $\delta C/C$ is the varactor capacitance change due to the RF voltage swing. The dispersion compensation ability is proportional to the varactor capacitance change $\delta C/C$ caused by the RF voltage swing.

Dispersion caused by signal amplitude delay as the optical signal propagates through along the fiber is equal in amplitude but opposite in sign for the RF positive swing and negative swing. From Equation 1, it can be seen that when the RF voltage swing is large (amplitude 4-8 volts), the capacitance change will be nonlinear. Total capacitance change is unequal under the RF voltage positive swing versus negative swing. An unequal total capacitance change in the RF swing will cause the delay compensation to be unequal, which may introduce compensation errors. A method of equalization is needed.

Figure 1:
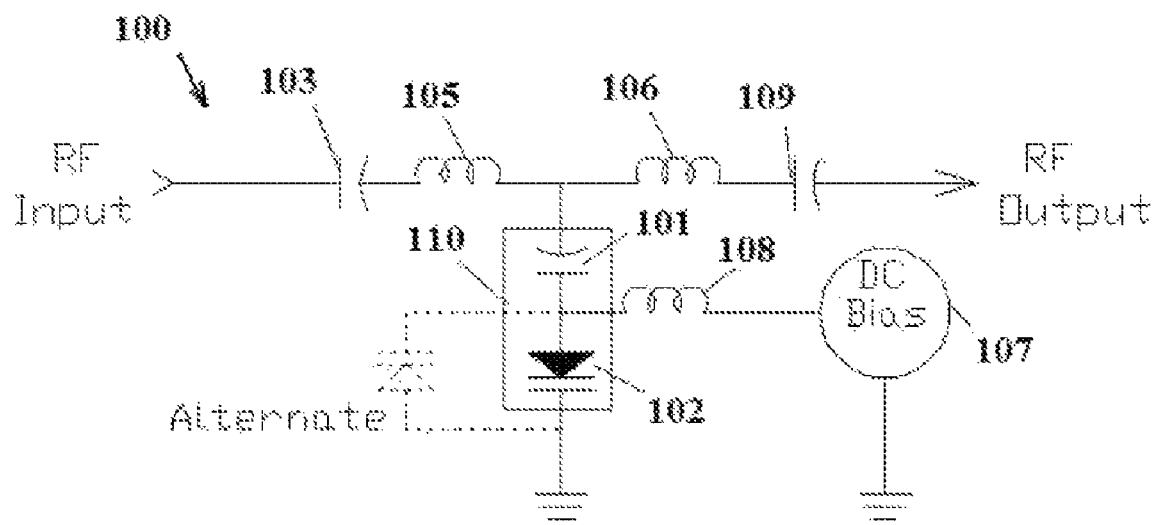
FIG. 1 illustrates an exemplary embodiment of a dispersion compensating circuit.

FIG. 1 illustrates an exemplary embodiment of a dispersion compensating circuit for optical transmission system in accordance with the present invention. In this embodiment, the polarity of the varactor is controllable for versatility.

In FIG. 1, circuit 100 includes a capacitor 103, an inductor 105, an inductor 106, a DC bias 107, an inductor 108, a capacitor 109 and capacitive structure 110, which includes a varactor 102 and capacitor 101. Capacitor 101 is used to linearize the overall capacitance change of varactor 102 under large RF voltage swing. The value of capacitor 101 may be selected roughly equal to the largest capacitive value of varactor 102 permitted under the RF voltage swing.

The effect of capacitor 101 can be understood by the following explanation. When the capacitance of varactor 102 is equal to the capacitance of capacitor 101, half of the RF voltage is dropped at varactor 102. When the RF voltage swing is in the positive direction, the capacitance of varactor 102 increases and more of the RF voltage will be dropped at capacitor 101. When the RF voltage swings negatively, the capacitance of varactor 102 decreases and most of the RF voltage will be dropped at the varactor 102. Changing the value of capacitor 101 can reduce the RF voltage change on varactor 102 during the positive RF swing. This procedure can make the total capacitance change for the positive voltage swing and the negative swing equal in amplitude. Inductors 105 and 106 and a combination of capacitor 101 in series with capacitor 102 form a low-pass Tchebyscheff filter with a 0.1 dB ripple, which extends the frequency response up to 1.5 GHz. Capacitor 101 provides a linearizing function for the output signal.

Inductor 108 (it is not shown on the graph) is RF blocking inductor used to supply DC bias 107 to varactor 102. The polarity of varactor 102 can be reversed, depending on application conditions. For example, if the RF output is used for a laser driver, the polarity of varactor 102 depends on the laser grounding condition. Alternatively, if the RF output is used at the optical receiver side, the polarity of varactor 102 depends on the number of RF amplifiers before the signal reached the circuit RF input side.

One of the advantages of circuit 100 is that the bias voltage provided by DC bias 107 on varactor 102, is the only adjustment required. Further, as mentioned above, capacitor 101 linearizes the overall capacitance change under large RF voltage swing. Absent capacitor 101, the capacitance of varactor 102 becomes very non-linear with large voltages. Because larger voltages may be used with the inclusion of capacitor 101, the varactor circuit may be used with larger powered lasers for longer transmission.

Reference values for an exemplary embodiment of circuit 100 are as follows:
the inductance of inductor 105=the inductance of inductor 106=8.2 nH;
the capacitance of capacitor 101=3.9 pf,
varactor 102 is Toshiba varactor 1SV 239;
the capacitance of capacitor 103=the capacitance of capacitor 109=0.1 µf; and
the inductance of inductor 108=10 µH.

If circuit 100, using the parameters discussed above, is used at the optical receiver side, the input RF power level should be at 38-42 dBmv/channel. Total RF drive power is about 10 dBm with 2 dB power in error.

Circuit 100 can be used both for laser transmitter delay correction and for delay correction at the optical receiver side. When circuit 100 is used for laser transmitter delay correction, network RF output should be connected to the laser. When circuit 100 is used for the optical receiver side dispersion correction, the network RF output should be connected to the RF amplifier.

Additional embodiments will now be described with reference to FIGS. 2 and 3.

Figure 2:
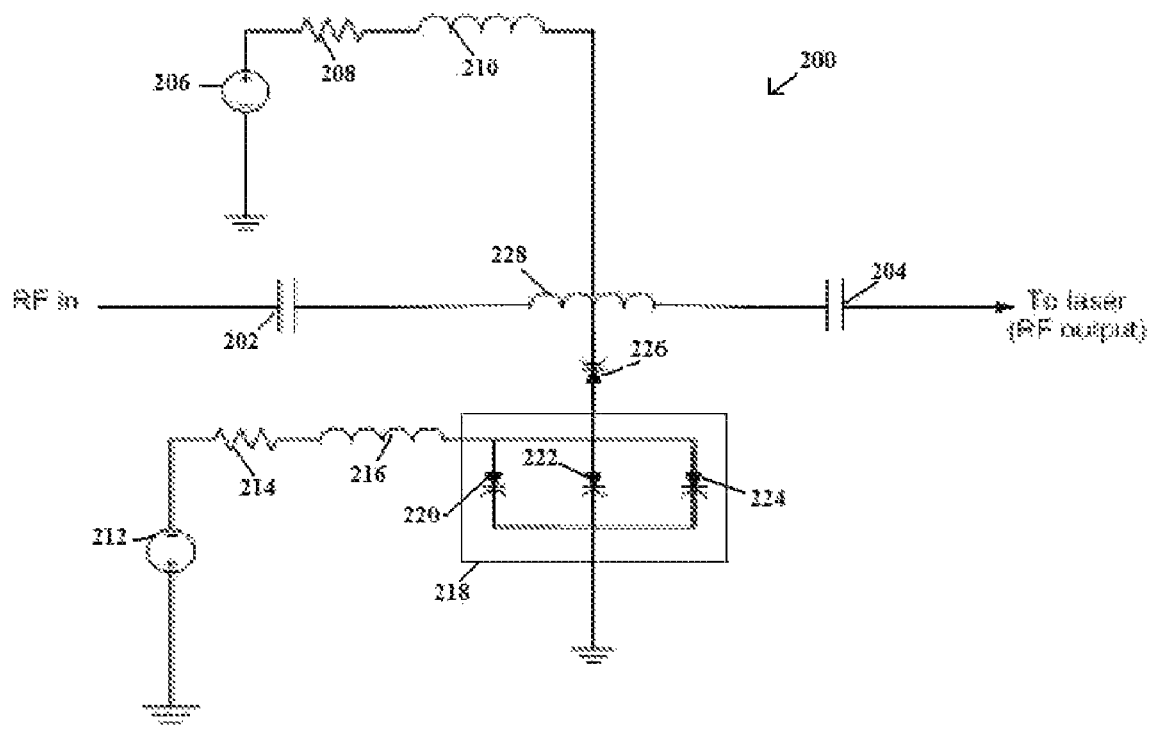
FIG. 2 illustrates an exemplary embodiment of a dispersion compensating circuit in accordance with the present invention.
Figure 3:
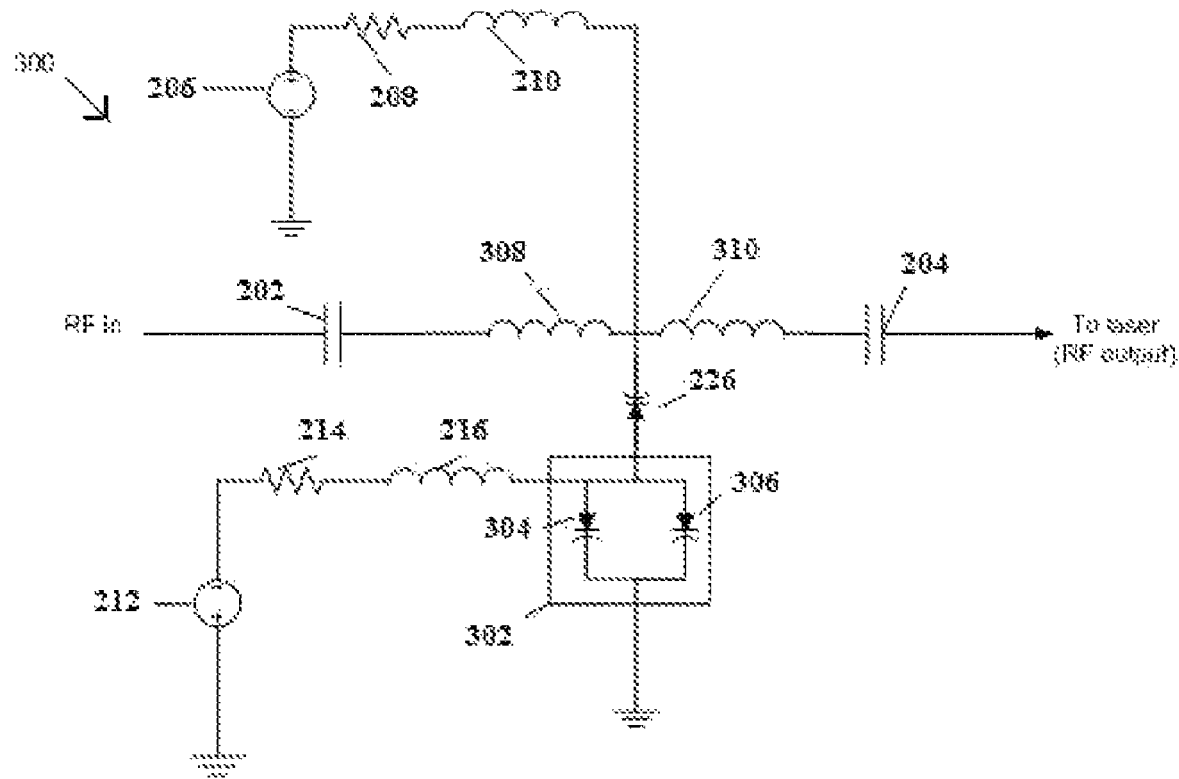
FIG. 3 illustrates another exemplary embodiment of a dispersion compensating circuit in accordance with the present invention.

The exemplary embodiments illustrated in FIGS. 2 and 3 use a full-pass filter, and employ multiple varactors in order to greatly expand capability beyond the bandwidth and/or transmission distance required for current B-PON or G-PON applications. One of skill in the art would select the appropriate varactor type for an associated specific application.

In FIG. 2, circuit 200 includes an input capacitor 202, an output capacitor 204, a first bias source 206, a resistor 208, an inductor 210, a second bias source 212, a resistor 214, an inductor 216, a varactor bank 218, which includes varactors 220, 222 and 224 in parallel, a varactor 226, and a center-tapped inductor 228.

In circuit 200, two bias sources 206 and 212 provide controlled bias to varactor 226. Inductor 210 is an RF blocking inductor used to isolate a DC bias from circuit 200. Bias source 212 provides a controlled bias to varactor bank 218. Inductor 216 is an RF blocking inductor used to isolate a DC bias from circuit 200. First bias source 206 and second bias source 212 may be separately controlled In an exemplary embodiment, each of bias source 206 and bias source 212 is a voltage source, which can be electronically set, in combination with a remotely controllable Digital to Analog Converter (DAC). As such, bias source 206 may be individually set and/or adjusted, via the remotely controllable DAC, to establish a bias voltage for the varactor 226 and varactor bank 218 to compensate for changing parameters within circuit 200 as a result of temperature, age or fiber link reach. Similarly, bias source 212 may be individually set and/or adjusted, via the corresponding remotely controllably DAC, to establish a bias voltage for the varactor bank 218 to compensate for changing parameters within circuit 200 as a result of temperature, age or fiber link reach.

By applying different bias voltages, the circuit can be precisely tuned to balance the positive and negative capacitance swings of the input RF signal.

In one embodiment, bias source 206 is a bias source that can be set via a remotely controllable DAC. Accordingly, by monitoring the output of the circuit by known methods, the circuit may be tuned by adjusting at least one of the amplitude and the polarity of the bias signal from bias source 206 by known methods, for example by the remotely controllable DAC.

In another embodiment, bias source 212 is a bias source that can be set via a remotely controllable DAC. Accordingly, by monitoring the output of the circuit by known methods, the circuit may be tuned by adjusting at least one of the amplitude of the bias signal from bias source 206 by known methods and by adjusting at least one of the amplitude of the bias signal from bias source 212 by known methods, for example by the remotely controllable DAC.

In yet another embodiment, bias source 206 and bias source 212 are remotely controllable bias sources as discussed above. Accordingly, by monitoring the output of the circuit by known methods, the circuit may be tuned by adjusting at least one of the amplitude and the polarity of the bias signal from bias source 212 by known methods, for example by the remotely controllable DAC.

A working example of a circuit as illustrated in FIG. 2 included the following parameters:
the resistance of resistor 208=10 KΩ;
the inductance of inductor 210=1 µH;
the capacitance of capacitor 202=0.1 µF;
the inductance of center-tapped inductor 228=14 nH;
the capacitance of output capacitor 204=0.1 µF;
the resistance of resistor 214=10 KΩ;
the inductance of inductor 216=1 µH; and
each of varactors 220, 222, 224 and 226 comprises a Toshiba varactor 1SV 239.

Other embodiments of the present invention may use a single varactor in place of varactor bank 218. Further, other embodiments of the present invention may use two varactors in parallel as a varactor bank.

Other embodiments of the present invention may include a capacitive unit disposed between varactor 226 and varactor bank 218. Such a capacitive unit may include at least one of a capacitor or a varactor, and is used to enable independent adjustment of the bias on each of varactor 226 and varactor bank 218. The embodiments may further include a shunt inductor, i.e. connected to ground, in order to bias varactor 226 independently of varactor bank 218.

The exemplary embodiment illustrated in FIG. 3, is an example of a varactor bank using two varactors in parallel in accordance with the present invention. Circuit 300 illustrated in FIG. 3 differs slightly from circuit 200 of FIG. 2. Specifically, circuit 300 includes a varactor bank 302, which includes a first varactor 304 arranged in parallel with a second varactor 306. Further, circuit 300 includes separate wire wound inductors 308 and 310 in place of center-tapped inductor 228 used in FIG. 2.

A working example of a circuit as illustrated in FIG. 3 included the following parameters:
the resistance of resistor 208=10 KΩ;
the inductance of inductor 210=1 μH;
the capacitance of capacitor 202=0.1 μF;
the inductance of inductor 308=6.2 nH;
the inductance of inductor 310=6.2 nH;
the capacitance of output capacitor 204=0.1 μF;
the resistance of resistor 214=10 KΩ;
the inductance of inductor 216=1 μH;
and each of varactors 304 and 306 were chosen from MA/COM with the part number MA4ST1200.

One aspect of the present invention includes a capacitive structure including a first varactor connected in series with a varactor bank. The varactor bank includes a plurality of varactors that arranged in parallel and that are placed in opposite polarity to the first varactor. This arrangement linearizes the total capacitance of the capacitor structure. As such, the first aspect of the present invention enables the use of large voltage signals, which therefore enables the use of the circuit of driving large powered lasers.

Those of skill in the art will appreciate that the present invention introduces a compensation method for the nonlinear varactor capacitance change under large RF driving voltage. Thus linearized delay time compensation can be obtained under large RF drive voltage. The compensating delay time can be easily and precisely controlled so that different fiber lengths can be easily compensated with a high degree of accuracy. At high optical output power of 10-13 dBm, for a 20 km fiber application, and at high frequencies, CSO improvements greater than 20 dB can be realized.

In an HFC network, the present invention allows DWDM narrowcast directly modulated laser transmitters to carry wide bandwidth of digital payload and to extend the single mode fiber link reach by compensating for fiber dispersion and hence reduces the LFNR in the analog band (50-550 Mhz).

The present invention also reduces the total reverse voltage on the varactor so that the varactor reverse voltage breakdown can be avoided even under the large RF drive voltage conditions. The present invention can also be used to improved delay correction for an externally modulated laser transmitter.

Figure 4:
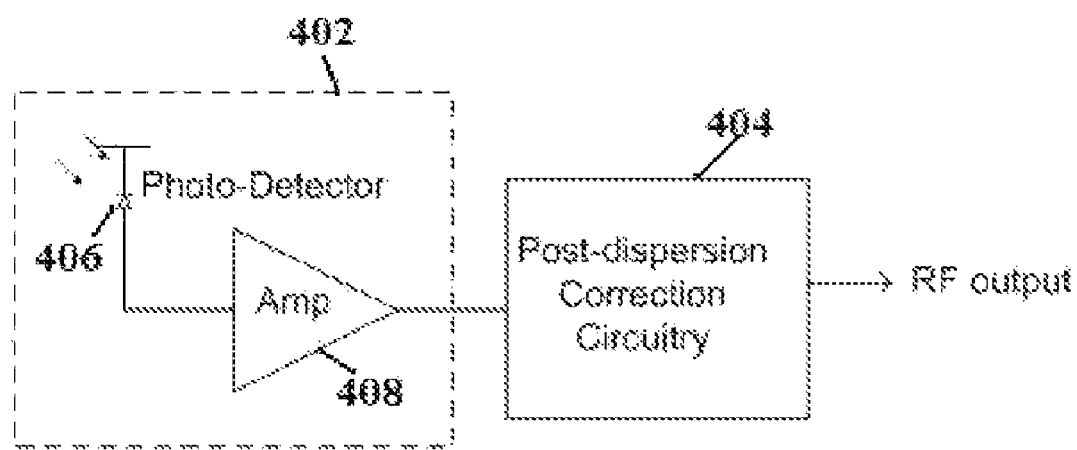
FIG. 4 illustrates an exemplary use of a post-dispersion compensating circuit in accordance with the present invention.

The present invention can additionally be used for post-dispersion correction at the node receiver in a CATV HFC network to compensate for fiber dispersion, for example as illustrated in FIG. 4. In the figures, post-dispersion correction circuitry 404 is disposed to receive output from an optical receiver 402. Optical receiver 402 includes a photo-detector 406 and a Radio Frequency (RF) amplifier 408. Photo-detector 406 receives light signals and generates electrical signals corresponding thereto. RF amplifier 408 amplifies the electrical signals and provides the amplified electrical signals to post-dispersion correction circuitry 404, which in accordance with the many embodiments of the present invention, modifies the output signal to compensate for the negative effects of dispersion.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for use with an input signal, said apparatus comprising:
a capacitive structure; and
an inductor,
wherein said capacitive structure and said inductor are arranged as a low-pass filter for the input signal and to provide an output signal,
wherein said capacitive structure comprises a varactor and a capacitor,
wherein said varactor is disposed in series with said capacitor, and
wherein the capacitor has a capacitive value substantially equal to the largest capacitive value of the varactor permitted under an expected RF voltage swing to be applied as an input signal.

2. The apparatus of claim 1, further comprising:
a DC bias source operable to provide a DC bias signal having an amplitude and a polarity,
wherein said varactor is configured to receive a first signal based on the DC bias signal, and
wherein said varactor is operable to have a polarity based on the first signal when receiving the first signal.

3. The apparatus of claim 1, further comprising:
a laser driving circuit operable to receive the output signal and to generate a laser driving signal; and
a laser operable receive the laser driving signal.

4. The apparatus of claim 1, further comprising a second inductor.

5. An apparatus for use with an input signal, said apparatus comprising:
a radio frequency amplifier arranged to receive the input signal, said radio frequency amplifier operable to generate an amplified signal based on the input signal;
a capacitive structure; and
an inductor,
wherein said capacitive structure and said inductor are arranged as a low-pass filter for the amplified signal and are arranged to provide an output signal, wherein said capacitive structure comprises a varactor and a capacitor, wherein said varactor is disposed in series with said capacitor, and wherein the capacitor has a capacitive value substantially equal to the largest capacitive value of the varactor permitted under an expected RF voltage swing to be applied as an input signal.

6. An apparatus for use with an input signal, said apparatus comprising:

a capacitive structure; and an inductor, wherein said capacitive structure and said inductor are arranged as an all-pass filter for the input signal and to provide an output signal, wherein said capacitive structure comprises a first varactor and a capacitive element, wherein said first varactor is disposed in series with said capacitive element, and wherein the capacitive element has a capacitive value substantially equal to the largest capacitive value of the varactor permitted under an expected RF voltage swing to be applied as an input signal.

7. The apparatus of claim 6, further comprising a digital to analog converter operable to provide a control signal, wherein the control signal is operable to control at least one of said first DC bias source and said second DC bias source.

8. The apparatus of claim 6, wherein said capacitive structure comprises a capacitive unit disposed between said first varactor and said capacitive element.

9. The apparatus of claim 6, wherein said inductor comprises a center-tap inductor.

10. The apparatus of claim 6, further comprising a second inductor.

11. The apparatus of claim 6, wherein said capacitive element includes a varactor bank having a second varactor and a third varactor.

12. The apparatus of claim 11, further comprising:

a first DC bias source operable to provide a first DC bias signal having a first amplitude and a first polarity to said first varactor; and a second DC bias source operable to provide a second DC bias signal having a second amplitude and a second polarity to said first varactor and said varactor bank, wherein said first varactor is arranged in an opposite polarity to said varactor bank, and wherein the first polarity is opposite to the second polarity.

13. The apparatus of claim 11, wherein said second varactor has a second capacitance as a function of voltage, wherein said third varactor has a third capacitance as a function of voltage, and wherein the second capacitance is equal to the third capacitance.

14. The apparatus of claim 11, wherein said second varactor has a second capacitance as a function of voltage, wherein said first varactor has a first capacitance as a function of voltage, and wherein the first capacitance is equal to the second capacitance.

15. The apparatus of claim 11, wherein said varactor bank further comprises a fourth varactor arranged in parallel with said second varactor.

16. The apparatus of claim 15, wherein said second varactor has a second capacitance as a function of voltage, wherein said fourth varactor has a fourth capacitance as a function of voltage, and wherein the second capacitance and the fourth capacitance are equal.

17. The apparatus of claim 16, wherein said first varactor has a first capacitance as a function of voltage, and wherein the first capacitance is equal to the second capacitance.

18. The apparatus of claim 6, wherein said capacitive element includes a capacitor.

* * * * *